(12) United States Patent
Akaike et al.

(10) Patent No.: US 6,307,390 B1
(45) Date of Patent: Oct. 23, 2001

(54) ALIGNER AND METHOD FOR INSPECTING SEMICONDUCTOR WAFER USING SHELL

(75) Inventors: Yutaka Akaike; Isao Kono, both of Yamanashi-ken; Satoshi Sano, Yamanashi, all of (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/288,291

(22) Filed: Apr. 8, 1999

(30) Foreign Application Priority Data

Apr. 13, 1998 (JP) .................................................. 10-117767

(51) Int. Cl.[7] .................................................... G01R 31/02
(52) U.S. Cl. ............................................................. 324/758
(58) Field of Search .................................... 324/758, 753, 324/754, 756, 757, 158.1, 755, 762, 765

(56) References Cited

U.S. PATENT DOCUMENTS 5,604,446 * 2/1997 Sano ....................................... 324/758

FOREIGN PATENT DOCUMENTS

| 7-231019 | 8/1995 | (JP) . |
| 8-5666 | 1/1996 | (JP) . |
| 8-340030 | 12/1996 | (JP) . |

* cited by examiner

*Primary Examiner*—Safet Metjahic
*Assistant Examiner*—J Kerveros
(74) *Attorney, Agent, or Firm*—Oblon, Spivak, McClelland, Maier & Neustadt, P.C.

(57) ABSTRACT

An aligner according to the present invention is constituted by integrating a wafer chuck, a wafer and a contactor, which are aligned with one another, into one piece by vacuum adsorptivity. A vacuum exhaust apparatus for generating the vacuum adsorptivity, includes first and second valve mechanisms, a valve operation mechanism for opening/closing these valve mechanisms, first and second solenoid valves connected to the valve operation mechanism through a vacuum exhaust line, and a vacuum leak detecting pressure gauge interposed between the first solenoid valve and the valve operation mechanism.

9 Claims, 3 Drawing Sheets

ALIGNER AND METHOD FOR INSPECTING SEMICONDUCTOR WAFER USING SHELL

BACKGROUND OF THE INVENTION

The present invention relates to an aligner and, more specifically, to an aligner used for inspecting a number of semiconductor elements formed on a semiconductor wafer by one operation.

The present invention corresponds to that of Japanese Patent Application No. 10-54423 which has recently been filed by the same inventors as those of the present invention, and relates to an aligner wherein a contactor is brought into contact with a wafer holding member, which holds a semiconductor wafer, by vacuum adsorption to integrate the semiconductor wafer, contactor and wafer holding member into one piece.

In semiconductor inspection, electric characteristics of semiconductor elements (each referred to as a chip hereinafter) formed on a semiconductor wafer (referred to as a wafer hereinafter) are tested to screen defect-free chips. The defect-free chips are packaged with synthetic resin or ceramics in an assembly step. In a reliability test, a temperature stress or an electrical stress is applied to the packaged chips to detect a latent defect and the like. If a defective chip is detected, it is eliminated.

Chips are decreased in size and increased in packing density as electrical appliances become smaller and more functional. Recently various mounting techniques for making semiconductor products smaller have been developed. In particular, a technique of mounting a chip as a so-called bare chip without being packaged is developed. In order to put bare chips on the market, their quality assurance is required. For the quality-assured bare chips, they should take a reliability test to put them on the market. A probe apparatus can be used for the reliability test; however, in this case, bare chips have to be tested one by one. Since, moreover, a long time is required for testing one bare chip, the reliability test using the probe apparatus has a problem of costs. To inspect bare chips using a conventional reliability test apparatus, various difficulties such as electrical connection between a bare chip and a socket have to be resolved. Since a bare chip is small, its handling is considerably complicated and its inspection costs are increased.

A technique of conducting a reliability test on a plurality of wafers at once, is proposed in, for example, Jpn. Pat. Appln. KOKAI Publications Nos. 7-231019, 8-5666 and 8-340030.

Conventionally, in order to bring a plurality of contact terminals of a contact into contact with a plurality of chips formed on a wafer, the contact and wafer are arranged opposite to each other, and the contact terminals are visually aligned with their corresponding electrode pads of the wafer (hereinafter referred to as alignment) and brought into contact with the chips together. For this reason, a long time is required for the alignment, which reduces operation efficiency and applies a great load to an operator, thereby causing variations in alignment precision. As described above, the conventional alignment has the problem in which it is difficult to bring a plurality of contact terminals of a contactor into stable contact with a plurality of chips formed on a wafer.

In the foregoing Japanese Patent Application No. 10-54423, the inventors of the present invention proposes the following aligner as an alignment apparatus. A wafer holding member for holding a wafer by vacuum adsorption (hereinafter referred to as a wafer chuck) is moved in X, Y, Z and θ directions to align the wafer and contactor with each other. The contactor is then placed into contact with the wafer chuck by vacuum adsorption to integrate the contactor, wafer chuck and table into one piece. However, the aligner does not have a mechanism for checking vacuum adsorption among the wafer chuck, wafer and contactor or a mechanism for checking vacuum pressure among them. For this reason, it has recently been recognized that if the vacuum adsorption is lowered, electrical contact between the wafer and contactor becomes poor during the reliability test and, in extreme cases, the integrated wafer chuck, wafer and contactor are likely to separate from each other.

BRIEF SUMMARY OF THE INVENTION

The present invention has been developed in order to resolve the above problems. It is accordingly an object of the present invention to provide an aligner capable of confirming whether a vacuum leak occurs among a wafer chuck, a semiconductor wafer and a contactor.

According to a first aspect of the present invention, there is provided a method of carrying out a test on electric characteristics of plural semiconductor elements formed on a semiconductor wafer, the method comprising:

placing a wafer holding member on a table and holding the wafer holding member thereon by vacuum adsorptivity;

placing the semiconductor wafer on the wafer holding member and holding the semiconductor wafer thereon by vacuum adsorptivity;

bringing a contactor into contact with the semiconductor wafer held on the wafer holding member, and holding the contact on the wafer holding member by vacuum adsorptivity;

confirming the vacuum adsorptivity by which the contactor and the semiconductor wafer are held on the wafer holding member, using a pressure detector;

releasing the vacuum adsorptivity by which the wafer holding member is held on the table, and allowing an aligner, which is formed by integrating the wafer holding member, the semiconductor wafer and the contactor into one piece by the vacuum adsorptivity, to move from the table; and transporting the aligner to a test apparatus to carry out the test on the electric characteristics of the plural semiconductor elements formed on the semiconductor wafer.

According to a second aspect of the present invention, there is provided an aligner comprising:

a contactor having a plurality of contact terminals for bringing the contactor into contact with a semiconductor wafer;

a wafer holding member including a first vacuum holding mechanism for holding the semiconductor wafer by vacuum adsorptivity and a second vacuum holding mechanism for holding the contactor by vacuum adsorptivity;

a table having a third vacuum holding mechanism for holding the wafer holding member by vacuum adsorptivity; and at least one pressure gauge connected to the first vacuum holding mechanism, the second vacuum holding mechanism, and the third vacuum holding mechanism, wherein the pressure gauge detects a pressure of at least one vacuum holding mechanism in the first vacuum holding mechanism, the second vacuum holding mechanism, and the third vacuum holding mechanism, thereby confirming a vacuum adsorbing state in the vacuum holding mechanism.

Preferably, each of the first vacuum holding mechanism and the second vacuum holding mechanism includes:

a vacuum adsorbing internal channel provided in the wafer holding member;

a vacuum adsorbing groove formed in a surface of the wafer holding member on which the semiconductor wafer and the contactor are placed, and connected to the vacuum adsorbing internal channel;

a valve mechanism connected to the vacuum adsorbing internal channel; and a selector valve connected to the valve mechanism, for selectively connecting the valve mechanism to one of a vacuum exhaust apparatus, an air-open apparatus and an air-close apparatus.

Preferably, the selector valve of the second vacuum holding mechanism includes a first selector valve and a second selector valve, and the first selector valve selectively connects the valve mechanism to one of the air-close apparatus and the second selector valve, and the second selector valve selectively connects the first selector valve to one of the vacuum exhaust apparatus and the air-open apparatus.

Preferably, the vacuum adsorbing groove of the second vacuum holding mechanism includes a first ring-shaped groove for adsorbing the semiconductor wafer and a second ring-shaped groove for adsorbing the contactor.

Preferably, the first selector valve and the second selector valve are each a three-port solenoid valve.

Preferably, the valve mechanism of each of the first vacuum holding mechanism and the second vacuum holding mechanism includes a valve operation mechanism having an air cylinder for attachment and detachment.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

An aligner 10 according to an embodiment of the present invention will now be described with reference to FIGS. 1 to 5B.

Figure 1:
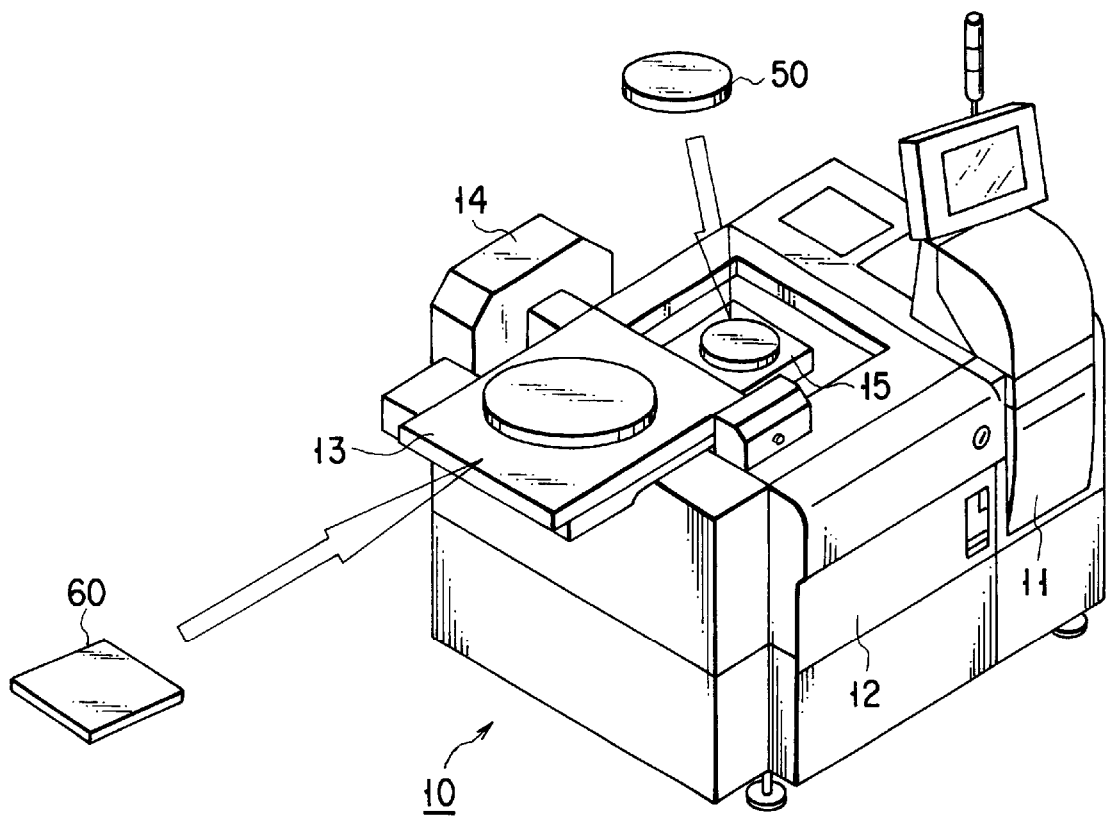
FIG. 1 is a perspective view of the outward appearance of an aligner according to an embodiment of the present invention.

As illustrated in FIG. 1, the aligner 10 includes a loader room 11 for receiving wafers W (see FIG. 2) in units of carrier and loading/unloading the wafers W, and an alignment room 12 which is adjacent to the loader room 11 with a partition therebetween. The alignment room 12 is brought into contact and integrated with a wafer holding member (hereinafter referred to as a wafer chuck) 50, wafers W held by the wafer chuck 50, and a contactor 60 after the wafers W and contactor 60 are aligned with each other.

The loader room 11 includes a transportation mechanism (fork) and another mechanism (sub-chuck) for preliminarily aligning the wafers (referred to as pre-alignment hereinafter). The wafers W are transported one by one from a carrier. During the transportation, the wafers W are preliminarily aligned on the sub-chuck based on their orientation flat and then transported to the alignment room 12 by the fork.

A head plate 13 is attached to the alignment room 12 such that it can be opened and closed. The contactor 60 is placed on the head plate 13, and the head plate 13 is inserted into or removed from the top opening portion of the alignment room 12 by an open/close driving mechanism 14.

Figure 2:
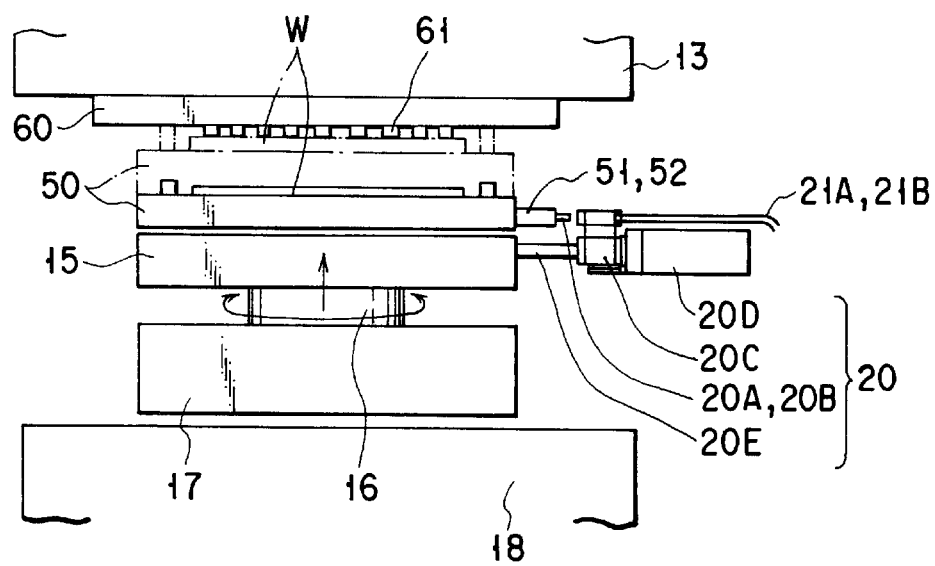
FIG. 2 is a side view of the aligner shown in FIG. 1 in which a wafer chuck, a wafer and a contactor are integrated into one component.

In the alignment room 12, a table 15 (hereinafter referred to as a main chuck) is provided movably in X, Y, Z and θ directions under the head plate 13. The wafer chuck 50 is placed on the main chuck 15. As shown in FIG. 2, the main chuck 15 can be raised and lowered in the Z direction and rotated normally or reversely in the θ direction on an X stage 17 by a rotation hoisting and lowering mechanism 16. The X stage 17 is supported on a Y stage 18 such that it can be reciprocated in the X direction, while the Y stage 18 can be reciprocated in the Y direction on a base (not shown).

In the loader room 11, the pre-aligned wafers W are transported to the wafer chuck 50 in the alignment room 12 by the folk.

The alignment room 12 includes an alignment mechanism (not shown), and the alignment mechanism has an upper camera fixed to an alignment bridge and a lower camera fixed to the main chuck 15. An image of electrode pads for inspecting the wafers W held on the wafer chuck 50 is picked up by the upper camera by moving the main chuck 15, while an image of contact terminals (e.g. bump terminals) 61 of the contactor 60 is picked up by the lower camera by moving the main chuck 15. The wafers W and contactor 60 are aligned with each other on the basis of these images. This alignment mechanism can employ the technique proposed in Japanese Patent Application No. 10-54423.

After the wafers W are aligned in the alignment room 12, the main chuck 15 is hoisted by the rotation hoisting and lowering mechanism 16 and, as illustrated in FIG. 2, the wafer inspecting electrode pads and the bump terminals 61 are brought into contact with each other by one operation. As will be described later, the contactor 60 contacts the wafer chuck 50 by vacuum adsorption, and the wafer chuck 50, wafers W and contactor 60 are integrated into one shell.

The vacuum holding mechanisms utilizing vacuum adsorption will now be described with reference to FIGS. 3 to 5B.

First, a second vacuum holding mechanism for holding the contactor and a third vacuum holding mechanism for holding the wafer chuck will be described with reference to FIGS. 2 to 5B.

Figure 3:
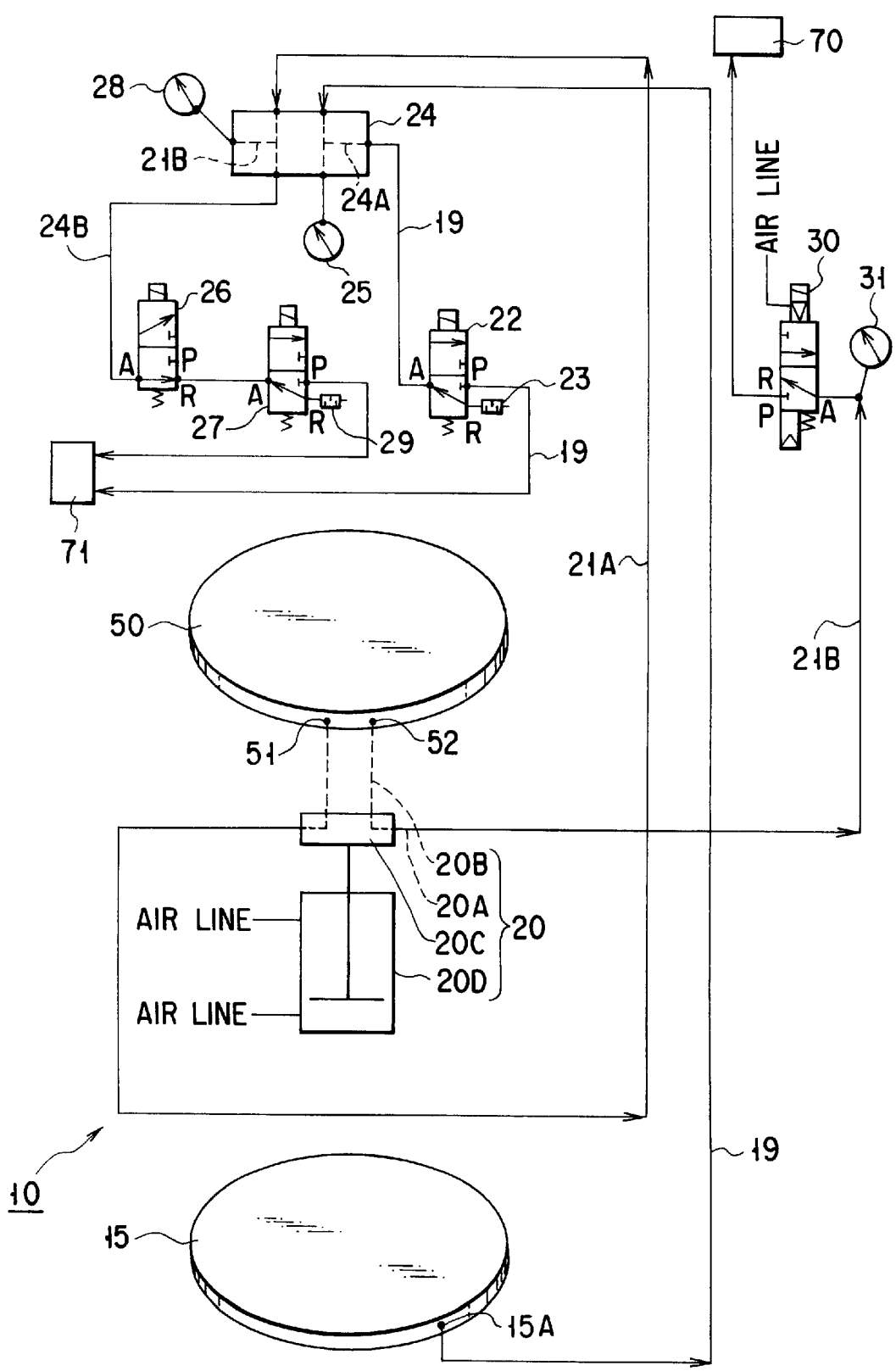
FIG. 3 is a view of a vacuum exhaust system applied to the aligner shown in FIG. 1.

An internal channel is formed inside the main chuck 15. This channel is opened as an inlet/outlet 15A (FIG. 3) in the peripheral surface of the main chuck 15. A vacuum exhaust system is connected to the inlet/outlet 15A through a vacuum exhaust line 19 (FIG. 3). The internal channel is exhausted by the vacuum exhaust system to generate vacuum adsorptivity. This vacuum adsorptivity causes the wafer chuck 50 to be held on the main chuck 15.

The wafer chuck 50 includes two internal channels. These internal channels communicate with their respective grooves (ring-shaped grooves) 53A and 53B (FIG. 4) formed in the surface of the wafer chuck 50, and they are formed as two inlets/outlets in the peripheral surface of the wafer chuck 50. The inlets/outlets are provided with a first valve mechanism 51 and a second valve mechanism 52, respectively, and the internal channels are connected to the vacuum exhaust lines 21A and 21B via the first and second valve mechanisms, respectively.

As illustrated in FIGS. 2 and 3, the first and second valve mechanisms 51 and 52 of the main chuck 15 are provided with a valve operation mechanism 20. The mechanism 20 is operated to open/close the first and second valve mechanisms 51 and 52. In other words, as shown in FIGS. 2 and 3, the valve operation mechanism 20 includes first and second quick joints 20A and 20B, a framework 20C having internal channels connected to the quick joints 20A and 20B, an air cylinder 20D having a piston rod fixed to the framework 20C, and a pair of guide rods 20E for guiding the framework 20C which advances and retreats by the air cylinder 20D. The air cylinder 20D moves the first and second quick joints 20A and 20B toward the first and second valve mechanisms 51 and 52. These quick joints 20A and 20B are inserted into the valve mechanisms 51 and 52 to open valve elements thereof. If the first and second quick joints 20A and 20B retreat and separate from the first and second valve mechanisms 51 and 52, the valve elements of the first and second valve mechanisms 51 and 52 are closed automatically.

The vacuum exhaust lines 21A and 21B are connected to the first and second quick joints 20A and 20B of the valve operation mechanism 20, and the internal channels and ring-shaped grooves 53A and 53B of the wafer chuck 50 are exhausted by means of the vacuum exhaust lines 21A and 21B, thus generating vacuum adsorptivity therein. The vacuum adsorptivity causes the wafers W and contactor 60 to be held on the wafer chuck 50.

The vacuum exhaust line 21A is connected to the internal channel for vacuum adsorption of the contactor 60, while the vacuum exhaust line 21B is connected to the internal channel for vacuum adsorption of the wafers W.

Referring to FIG. 3, as an example of a selector valve, a three-port type solenoid valve 22 is provided at the vacuum exhaust line 19 of the main chuck 15. When the solenoid valve 22 is energized, the main chuck 15 is connected to a vacuum exhaust apparatus 71 (P port side) and the wafer chuck 50 is held on the main chuck 15 by vacuum adsorptivity.

As shown in FIG. 3, when the solenoid valve 22 is de-energized, the main chuck 15 is connected to a silencer 23 (R port side) from the vacuum exhaust apparatus 71 through the solenoid valve 22, and the main chuck 15 is opened to air through the silencer (air-open apparatus) 23, with the result that the wafer chuck 50 can be released from the main chuck 15 and transported. The vacuum exhaust lines 19 and 21A are brought together by a manifold 24. A pressure gauge 25 is attached to a channel 24A alongside the vacuum exhaust line 19 to measure a degree of vacuum in a vacuum system from the internal channel of the main chuck 15 to the solenoid valve 22. Based on the measured value, a degree of vacuum adsorptivity in the main chuck 15 is detected.

At the vacuum exhaust line 21A of the wafer chuck 50, a first selector valve and a second selector valve are arranged in this order from the wafer chuck 50. In FIG. 3, first and second solenoid valves 26 and 27 of a three-port type are provided as the first and second selector valves.

Another pressure gauge 28 is attached to a channel 24B alongside the vacuum exhaust line 21A to measure a degree of vacuum in a vacuum system from the internal channel of the wafer chuck 50 (more specifically the internal channel formed alongside the wafer chuck to be adsorbed) to the first solenoid valve 26. Based on the measured value, a degree of vacuum (degree of vacuum adsorptivity) between the wafer chuck 50 and contactor 60 is detected.

As illustrated in FIG. 3, when the first and second solenoid valves 26 and 27 are de-energized, the wafer chuck 50 is connected to an air-open apparatus (ex. silencer) 29 (R-port side), and the vacuum adsorptivity is released. In this state, air is introduced into the shell constituted of the wafers W, wafer chuck 50 and contactor 60, and these can be separated and thus operated individually.

When the first solenoid valve 26 is de-energized and the second solenoid valve 27 is energized, the internal channels of the wafer chuck 50 are connected to the vacuum exhaust apparatus (P port side) through the first and second solenoid valves 26 and 27 and exhausted to generate vacuum adsorptivity. The vacuum adsorptivity causes the contactor 60 to be held on the wafer chuck 50 and they are integrated as one shell.

When the first solenoid valve 26 is energized and the second solenoid valve 27 is de-energized, the first solenoid valve 26 is closed from air. In other words, in FIG. 3, the first solenoid valve 26 is separated from the second solenoid valve 27 and cut off from air. At the same time, the second solenoid valve 27 is separated from the vacuum exhaust apparatus and connected to the silencer 29 and opened to air. Using the pressure gauge 28 in this state, a degree of vacuum in the exhausted shell is measured to check a leak of vacuum. The P port of the first solenoid valve 26 is sealed.

A first vacuum holding mechanism for holding wafers will now be described.

The vacuum exhaust line 21B of the above wafer chuck 50 is provided with a three-port type solenoid valve 30 as an example of a selector valve. When the valve 30 is energized, the internal channels of the wafer chuck 50 are connected to a vacuum exhaust apparatus 70 and the wafers W are held on the wafer chuck 50 by vacuum adsorptivity. The same apparatus can be used for both the vacuum exhaust apparatuses 70 and 71.

When the solenoid valve 30 is de-energized, the wafer chuck 50 is separated from the vacuum exhaust apparatus, the internal channels of the wafer chuck 50 are opened to air, and the wafers W are released from the vacuum adsorptivity.

A pressure gauge 31 is formed between the solenoid valve 30 and wafer chuck 50 to measure a degree of vacuum in a vacuum system from the solenoid valve 30 to the internal channel of the wafer chuck 50 (more specifically the internal channel formed alongside the wafers to be adsorbed) and then detect a degree of vacuum adsorptivity between the wafer chuck 50 and wafers W.

Figure 4:
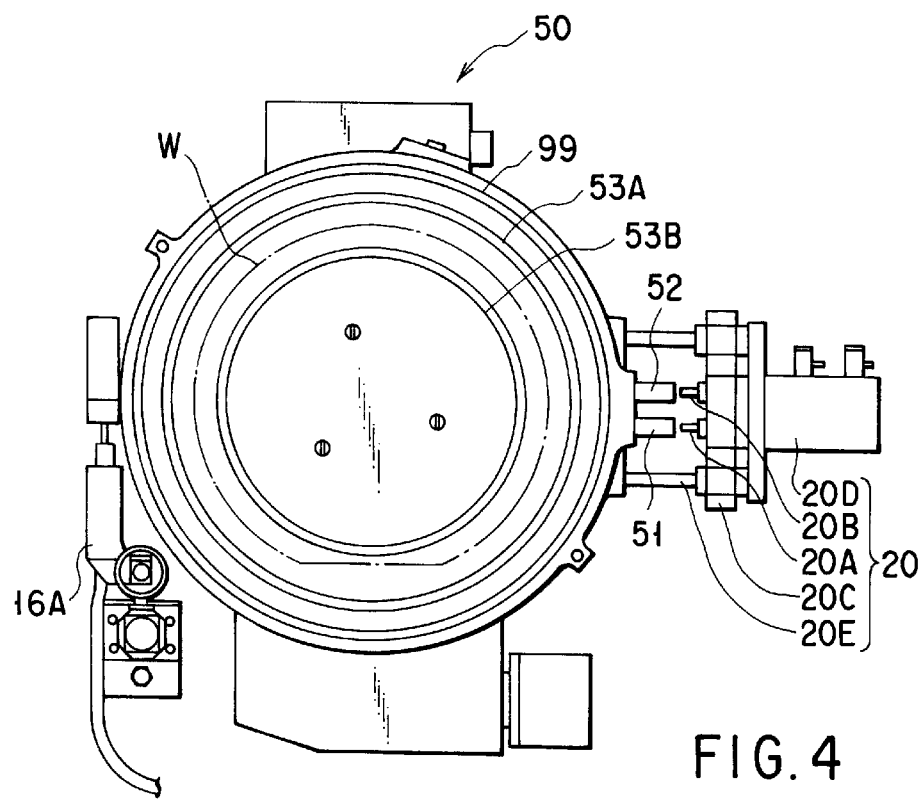
FIG. 4 is a plan view of the wafer chuck in the aligner of FIG. 1.

The foregoing wafer chuck 50 will be described further with reference to FIGS. 4, 5A and 5B. As illustrated in FIG. 4, ring-shaped grooves 53A and 53B are formed concentrically in the top surface of the wafer chuck 50 and, as shown in FIG. 5A, opening portions 55 of the internal channel 54 are formed in the ring-shaped grooves 53A and 53B.

A sealing 99, which is formed of a flexible, elastic member such as silicon rubber, is mounted on the peripheral portion of the top surface of the wafer chuck 50. The sealing 99 prevents a vacuum from leaking from a through-hole 56 when the wafer chuck 50 and contactor 60 are formed integrally as one piece. Consequently, the wafers W and contactor 60 are sequentially placed one on another on the wafer chuck 50, and these three elements are exhausted by the vacuum exhaust lines 21A and 21B to be integrated into one piece. In FIG. 4, reference numeral 16A indicates a θ-drive mechanism used at the time of alignment. The mechanism 16A rotates the main chuck 15 normally or reversely in the θ-direction.

Figure 5A:
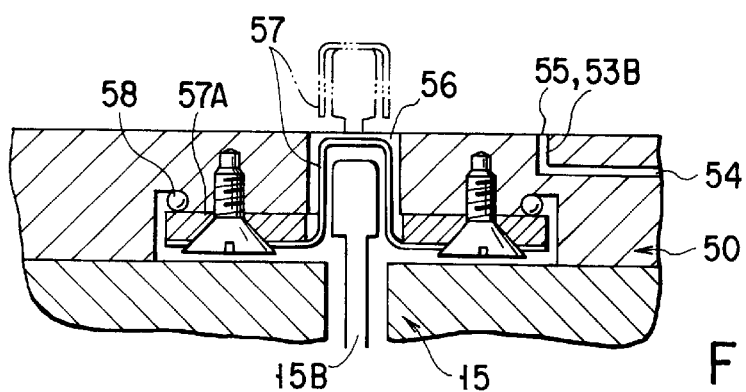
FIG. 5A is a view showing a relationship between the wafer chuck and three pins of a main chuck.
Figure 5B:
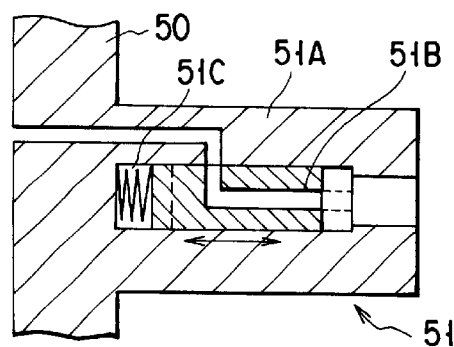
FIG. 5B is a view illustrating a first valve mechanism of the wafer chuck shown in FIG. 4.

The valve mechanisms 51 and 52 are constituted as illustrated in FIG. 5B. Since these mechanisms can be considered to be the same, only the mechanism 51 will be described as follows. The valve mechanism 51 includes a body 51A, a spool 51B reciprocated in the body 51A, and a spring 51C for always urging the spool 51B outside. If the first quick joint 20A is inserted into the valve mechanism 51, the spool 51B is pushed inside against the spring 51C to open the channel. If the first quick joint 20A is removed therefrom, the spool 51B is returned to the original position by the force of the spring 51C and the channel is cut off.

As shown in FIG. 5A, three pins 15B of the main chuck 15 move up and down to receive/transmit the wafers W from/onto the wafer chuck 50. More specifically, three through-holes 56 for the pins 15B are formed in the ring-shaped groove 53B of the wafer chuck 50. The outside diameter of each through-hole 56 is larger than that of each pin 15B. As shown in FIG. 5A, a closed-end cylindrical silicon rubber film 57 is attached to the through-hole 56, and the proximal end of the silicon rubber film 57 is screwed to a recess formed on the underside of the wafer chuck 50 through a packing 57A made of, e.g., aluminum. Moreover, an O-shaped ring 58 is mounted on the outer circumference of the packing 57A, and the silicon rubber film 57 and O-shaped ring 58 keep airtightness between the wafer chuck 50 and contactor 60 so as to maintain a reduced-pressure condition between them.

The tips of the three pins 15B are slightly thick and round to prevent the silicon rubber film 57 from being scratched. Even though the three pins 15B are raised and inserted into the through-holes 56 of the wafer chuck 50 and protruded from the top surface of the wafer chuck 50, expanding the silicon rubber film 57, as indicated by alternate long and short dashed lines in FIG. 5A, in order to receive/transmit the wafers W from/to the wafer chuck 50 placed on the main chuck 15, the reduced-pressure condition between the wafer chuck 50 and contactor 60 is maintained.

Next an operation of the aligner 10 will be described.

First the head plate 13 is opened by the open/close driving mechanism 14 and the contactor 60 is placed on the head plate 13. The wafer chuck 50 is placed on the main chuck 15. The first and second valve mechanisms 51 and 52 of the wafer chuck 50 are then aligned with the first and second quick joints 20A and 20B. The head plate 13 is closed by the open/close driving mechanism 14 and then the vacuum exhaust apparatus 71 is driven. If the solenoid valve 22 of the vacuum exhaust line 19 of the main chuck 15 is energized, the main chuck 15 is connected to the vacuum exhaust apparatus 71 by the solenoid valve 22, the internal channel of the main chuck 15 is exhausted, and the wafer chuck 50 is held on the main chuck 15 by vacuum adsorptivity. If the air cylinder 20 of the valve operation mechanism 20 is driven, the first and second quick joints 20A and 20B are connected to the first and second valve mechanisms 51 and 52 of the wafer chuck 50.

The wafers W are pre-aligned by the fork and sub-chuck in the loader room 11 and then placed on the wafer chuck 50 by the fork. If the solenoid valve 30 of the vacuum exhaust line 21B of the wafer chuck 50 is energized, the wafer chuck 50 is connected to the vacuum exhaust apparatus 70 by the solenoid valve 30, the internal channel for wafers in the wafer chuck 50 is exhausted, and the wafers W are held on the wafer chuck 50 by vacuum adsorptivity. A degree of the vacuum adsorptivity can be confirmed by the pressure gauge 31. Even after the degree of vacuum reaches a predetermined value, the exhaustion is continued until a check on a vacuum leak of the shell into which the wafer chuck 50 and wafers W are integrated, is completed. If, therefore, the wafers W are held on the wafer chuck 50, the X and Y stages 17 and 18 and θ-drive mechanism 16A are actuated and so is the alignment mechanism, thereby performing alignment between electrode pads of the wafers W and bump terminals 61 of the contactor 60. When the alignment is completed, the rotation hoisting and lowering mechanism 16 is actuated and the main chuck 15 is lifted, with the result that the electrode pads and bump terminals 61 contact each other at once as shown in FIG. 2.

If, in this state, the second solenoid valve 27 of the vacuum exhaust line 21A of the wafer chuck 50 is energized, the internal channel for the contactor in the wafer chuck 50 is connected to the vacuum exhaust apparatus 71 and exhausted, and the contactor 60 is held on the wafer chuck 50 by vacuum adsorption. Further, the wafer chuck 50 and contactor 60 are sealed air-tightly with the sealing 99, and the wafers W and contactor 60 are brought into contact with each other and integrated into one shell such that they can electrically conduct with each other. The vacuum adsorptivity can be confirmed by the pressure gauge 28.

If, after a degree of vacuum in the shell reaches a predetermined value, the first solenoid valve 26 is energized and the second solenoid valve 27 is de-energized, the first solenoid valve 26 is separated from the second solenoid valve 27, the vacuum system from the wafer chuck 50 to the first solenoid valve 26 is cut off from air, and the second solenoid valve 27 is separated from the vacuum exhaust apparatus 71 and opened to air. By this operation, the wafer chuck 50 is cut off exactly from the vacuum exhaust system. If, then, a measured value of the pressure gauge 28 does not vary, a degree of vacuum necessary for integrating the wafer chuck 50 and contactor 60 is maintained, the wafer chuck 50, wafers W and contactor 60 are reliably integrated into one shell, and the subsequent reliability test can be done exactly. If, however, a measured value of the pressure gauge 28 varies, a vacuum leak occurs between the wafer chuck 50 and contactor 60.

If a measured value of the pressure gauge 28 does not vary, the air cylinder 20D of the valve operation mechanism 20 is driven and the first and second quick joints 20A and 20B are released from the valve mechanisms 51 and 52, respectively, while the first solenoid valve 26 is being energized. If the solenoid valve 22 is de-energized, the wafer chuck 50 is detached from the main chuck 15 and can be transported. After that, the wafer chuck 50, wafers W and contactor 60 of the shell, are transported to a test apparatus (e.g., reliability test apparatus) and a test thereon is carried out.

After the reliability test is completed, the shell is carried to the aligner 10, and placed on the main chuck 15 in the same manner as detached and held thereon by vacuum adsorption. The valve operation mechanism 20 is connected to the first and second valve mechanisms 51 and 52. The first solenoid valve 26 of the vacuum exhaust line 21A is energized, while the second solenoid valve 27 is de-energized. Moreover, the solenoid valve 30 of the vacuum exhaust line 21B is energized and the wafers W are vacuum-adsorbed. If the first solenoid valve 26 is de-energized and so is the solenoid valve 30, the internal channels of the wafer chuck 50 are opened to air through the first and second solenoid valves 26 and 27 and the solenoid valve 30, and the shell can be separated into the wafer chuck 50, wafers W and contactor 60, and the wafers W are returned to the original position in the carrier by the fork in the loader room 11.

According to the embodiment described above, the vacuum exhaust apparatus of the aligner 10 includes the valve operation mechanism 20 for operating the first and second valve mechanisms 51 and 52 of the wafer chuck 50, the first and second solenoid valves 26 and 27 connected to the first and second quick joints 20A and 20B of the valve operation mechanism 20 through the vacuum exhaust lines 21A and 21B, respectively, and the pressure gauges 28 and 30 provided between the first solenoid valve 26 and valve operation mechanism 20. Therefore, a vacuum leak among the wafer chuck 50, wafers W and contactor 60, which are integrated into one shell, is checked, and the unseparable shell can be subjected to a reliability test. This test can be done with high reliability.

In the aligner 10 of the foregoing embodiment, the contactor 60 and wafer chuck 50 are placed by an operator. However, they can be done automatically.

According to the present invention, there can be provided an aligner wherein the wafer chuck, wafers and contactor are reliably integrated into one piece by vacuum adsorption and a vacuum leak among them is confirmed.

In the above embodiment, the bump terminals are employed as a contact terminal of the contactor 60. However, another terminal such as a probe and a needle can be adopted.

In the foregoing embodiment, the internal channel of the main chuck 15 is directly opened in the surface of the main chuck 15. However, another structure such as a ring-shaped groove, which is used in the wafer chuck 50, can be adopted.

In the above embodiment, the three-port type solenoid valve is used; however, a mechanism, which changes the vacuum exhaust line to one of the vacuum exhaust apparatus, air-open apparatus and air-close apparatus, can be adopted as a selector valve.

In the above embodiment, a silencer is used as the air-open apparatus. However, the vacuum exhaust line can directly be opened to air but not through the silencer.

In the foregoing embodiment, a closed terminal portion of a three-port type valve is used as the air-close apparatus. The present invention is not limited to this, but the vacuum exhaust line can be shut off from air.

In the foregoing embodiment, the vacuum holding mechanisms have different pressure gauges. However, they can have a common pressure gauge.

In the above embodiment, the valve mechanism includes the body 51A, spool 51B and spring 51C. Any valve mechanism can be adopted if vacuum adsorptivity for constituting an aligner including the contactor, semiconductor wafer and main chuck as one component can be generated and maintained until the aligner is transported and tested.

In the foregoing embodiment, a reliability test is carried out using the aligner. However, any test for measuring electric characteristics of plural semi-conductor elements formed on a semiconductor wafer can be done using the aligner of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of creating a transportable shell holding a semiconductor wafer to be tested therein, the method comprising:

placing a wafer holding member on a table and holding the wafer holding member thereon by vacuum adsorptivity;

placing the semiconductor wafer on the wafer holding member and holding the semiconductor wafer thereon by vacuum adsorptivity;

bringing a contactor into contact with the semiconductor wafer which is held on the wafer holding member by the vacuum adsorptivity, and holding the contactor on the wafer holding member by reducing a pressure between the contactor and the wafer holding member to create the shell which comprises the wafer holding member, the semiconductor wafer and the contactor each being connected to each other to make one integrated unit;

confirming the vacuum adsorptivity by which the contactor and the semiconductor wafer are held on the wafer holding member, using a pressure detector; and releasing the vacuum adsorptivity by which the wafer holding member is held on the table, and allowing the shell to move from the table.

2. An aligner for creating a transportable shell, comprising:

a contactor having a plurality of contact terminals for bringing the contactor into contact with a semiconductor wafer;

a wafer holding member including a first vacuum holding mechanism for holding the semiconductor wafer by vacuum adsorptivity and a second vacuum holding mechanism for holding the contactor by vacuum adsorptivity, the contactor being configured to be brought into contact with the semiconductor wafer which is held on the wafer holding member by the vacuum adsorptivity, and to be held on the wafer holding member by reducing a pressure between the contactor and the wafer holding member to create a shell which comprises the wafer holding member, the semiconductor wafer and the contactor each being connected to each other to make one integrated unit;

a table having a third vacuum holding mechanism for holding the wafer holding member by vacuum adsorptivity; and at least one pressure gauge connected to the first vacuum holding mechanism, the second vacuum holding mechanism, and the third vacuum holding mechanism, wherein the pressure gauge detects a pressure of at least one vacuum holding mechanism in the first vacuum holding mechanism, the second vacuum holding mechanism, and the third vacuum holding mechanism, thereby confirming a vacuum adsorbing state in the vacuum holding mechanism.

3. The aligner according to claim 2, wherein each of the first vacuum holding mechanism and the second vacuum holding mechanism includes:

a vacuum adsorbing internal channel provided in the wafer holding member;

a vacuum adsorbing groove formed in a surface of the wafer holding member on which the semiconductor wafer and the contactor are placed, and connected to the vacuum adsorbing internal channel;

a valve mechanism connected to the vacuum adsorbing internal channel; and a selector valve connected to the valve mechanism, for selectively connecting the valve mechanism to one of a vacuum exhaust apparatus, an air-open apparatus and an air-close apparatus.

4. The aligner according to claim 3, wherein the selector valve of the second vacuum holding mechanism includes a first selector valve and a second selector valve, and the first selector valve selectively connects the valve mechanism to one of the air-close apparatus and the second selector valve, and the second selector valve selectively connects the first selector valve to one of the vacuum exhaust apparatus and the air-open apparatus.

5. The aligner according to claim 3, wherein the vacuum adsorbing groove of the second vacuum holding mechanism includes a first ring-shaped groove for adsorbing the semiconductor wafer and a second ring-shaped groove for adsorbing the contactor.

6. The aligner according to claim 4, wherein the first selector valve and the second selector valve are each a three-port solenoid valve.

7. The aligner according to claim 3, wherein the valve mechanism of each of the first vacuum holding mechanism and the second vacuum holding mechanism includes a valve operation mechanism having an air cylinder for attachment and detachment.

8. An aligner for creating a transportable shell, comprising:

a contactor having a plurality of contact terminals for bringing the contactor into contact with a semiconductor wafer;

a wafer holding member including a first vacuum holding mechanism for holding the semiconductor wafer by vacuum adsorptivity and a second vacuum holding mechanism for holding the contactor by vacuum adsorptibity, the first vacuum holding mechanism having at least one sealing member provided on a peripheral portion of a top surface of the wafer holding member, the contactor being configured to be brought into contact with the semiconductor wafer which is held on the wafer holding member by the vacuum adsorptivity, and to be held on the wafer holding member by reducing a pressure between the contactor and the wafer holding member to create a shell which comprises the wafer holding member, the semiconductor wafer and the contactor each is connected to each other to make one integrated unit;

a table having a third vacuum holding mechanism for holding the wafer holding member by vacuum adsorptivity; and at least one pressure gauge connected to the first vacuum holding mechanism, the second vacuum holding mechanism, and the third vacuum holding mechanism, wherein the pressure gauge detects a pressure of at least one vacuum holding mechanism in the first vacuum holding mechanism, the second vacuum holding mechanism, and the third vacuum holding mechanism, thereby confirming a vacuum adsorbing state in the vacuum holding mechanism.

9. The aligner for creating a transportable shell according to claim 8, wherein the wafer holding member includes a plurality of through-holes formed in a surface on which the semiconductor wafer is mounted, closed-end cylindrical rubber films attached to each of the through-holes, and a plurality of pins moved up and down in each of the closed-end cylindrical rubber films and through each of the through-holes thereby to receive/transmit the semiconductor wafer.

* * * * *